(12) United States Patent
Bang et al.

(10) Patent No.: US 7,888,770 B2
(45) Date of Patent: Feb. 15, 2011

(54) FUSE BOX FOR SEMICONDUCTOR DEVICE AND METHOD OF FORMING SAME

(75) Inventors: Kwang-kyu Bang, Suwon-si (KR); Jong-hyun Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 911 days.

(21) Appl. No.: 11/764,385

(22) Filed: Jun. 18, 2007

(65) Prior Publication Data
US 2008/0036031 A1 Feb. 14, 2008

(30) Foreign Application Priority Data
Aug. 11, 2006 (KR) ............... 10-2006-0076372

(51) Int. Cl.
*H01L 29/00* (2006.01)
(52) U.S. Cl. .................. 257/529; 257/209
(58) Field of Classification Search .......... 257/173, 257/209, 529, 665, E21.592, E23.149, E23.15
See application file for complete search history.

(56) References Cited
U.S. PATENT DOCUMENTS 5,747,869 A * 5/1998 Prall et al. .................. 257/529
6,984,549 B1 * 1/2006 Manning .................... 438/132
7,057,217 B2 * 6/2006 Kang et al. ................. 257/209

FOREIGN PATENT DOCUMENTS

| JP | 2002-368094 | 12/2002 |
|---|---|---|
| JP | 2003-078010 | 3/2003 |
| JP | 2005-228878 | 8/2005 |

* cited by examiner

*Primary Examiner*—Hung Vu
(74) *Attorney, Agent, or Firm*—Volentine & Whitt, PLLC

(57) ABSTRACT

A fuse box for a semiconductor device is disclosed and includes a first fuse group comprising a plurality of first fuses, arranged in a first direction and having a first cutting axis, each first fuse comprising a first portion having a first fuse pitch, a second portion having a second fuse pitch smaller than the first fuse pitch, and a third portion connecting the first and second portions, a second fuse group comprising a plurality of second fuses, arranged in the first direction and having a second cutting axis, each second fuse comprising a first portion having a first fuse pitch, a second portion having a second fuse pitch smaller than the first fuse pitch, and a third portion connecting the first portion and the second portion, and a third fuse group comprising a plurality of third fuses, wherein each third fuse has either the first cutting axis or the second cutting axis, comprises a first pattern arranged in the first direction and having a first fuse pitch, and a second pattern arranged in a second direction and having a second fuse pitch smaller than the first fuse pitch, and is arranged to bypass the first fuse or the second fuse.

14 Claims, 12 Drawing Sheets

United States Patent US 7,888,770 B2

FUSE BOX FOR SEMICONDUCTOR DEVICE AND METHOD OF FORMING SAME

BACKGROUND OF THE INVENTION

1. Field of the Invention

The present invention relates to a fuse box for use in a semiconductor device. More particularly, the invention relates to a fuse box for a semiconductor device having a bypass structure capable of reducing the number of cutting axes, and a method of forming same.

This application claims the benefit of Korean Patent Application No. 10-2006-0076372, filed on Aug. 11, 2006, the subject matter of which is hereby incorporated by reference.

2. Description of the Related Art

With dramatically increased integration density, the possibility of defective memory cells within contemporary semiconductor memory devices increases. Production yield for such semiconductor devices will decrease in the absence of remedy for defective memory cells. Therefore, a number of different repair methods and mechanisms have been proposed, including various redundancy circuits.

Some of these repair methods essentially replace a defective memory cell within its constituent array of memory cells. That is, once a defective memory cell has been identified through routine testing, it may be replaced by a memory cell in a redundancy circuit. The physical removal of the defective memory cell and its replacement with a redundancy cell may be accomplished through the use of fuses contained in a fuse box. Fuse box circuits are commonly provided within the context of certain repair methods in the peripheral circuit region of the semiconductor memory device. By selectively "cutting" fuses in the fuse box the replacement of a defective memory cell may be accomplished.

FIG. 1A is a plan view illustrating a fuse box 10 used to repair a defective memory cell in a conventional semiconductor device. Fuse box 10 comprises an arrangement of fuses 15 separated by a predetermined fuse pitch "P". To facilitate cutting by a laser, each fuse 15 is exposed through a fuse opening region 13. The fuse 15 may be cut by irradiating it with a laser beam 17 having a predetermined diameter, (or spot size) "S". Thus, a normally conductive fuse 15 may be placed in a non-conductive state by cutting it with laser beam 17.

Each fuse 15 is formed as a trace having a predetermined width "W". Adjacent fuses 15 are separated by fuse pitch P. The width W of fuse 15 is sized relative to the spot size of laser beam 17 so as to absorb the laser energy. Further, the fuse pitch P is preferably greater than a deviation range for the positioning accuracy "A" of laser beam 17.

Unfortunately, as the integration density of contemporary semiconductor memory devices increases, the number of fuses associated with various repair methods and mechanisms also increases. All things being equal, this increased number of fuses results in a reduction in the fuse pitch P separating adjacent fuses and/or a reduction in the width W of each fuse. Accordingly, fuses run the risk of being damaged during the cutting of an adjacent fuse.

To reduce this risk of damage to adjacent fuses, an improved conventional fuse box has been proposed. This fuse box contains fuses having a relatively large fuse pitch in a fuse opening region. In the fuse box, the fuses are arranged such that a first relatively large fuse pitch in the fuse opening region is greater than the deviation range of the positioning accuracy of an applied laser. A second relatively narrow fuse pitch is used outside the fuse opening region so that the fuses may be arranged in a bundle. The fuse opening region is a region specifically designed to facilitate effective fuse cutting (i.e., expose the plurality of fuses to a cutting laser). Outside the fuse opening region fuse cutting is not performed and the fuses need not be exposed.

In the improved conventional fuse box, since the fuses are arranged with a relatively large first fuse pitch in the fuse opening region, fuse cutting can be easily performed without risk of damage to adjacent fuses. However, the closely bundled fuses outside the fuse opening region are still susceptible to melting caused by the heat of near-by fuse cutting. FIG. 1B is an actual image of a bridge 19 shorting two adjacent fuses. Bridge 19 was caused by melted fuse metal from proximate heating due to fuse cutting.

Additionally, in the improved conventional fuse box, the arrangement of fuses assumes a plurality of cutting axes. The provision of numerous fuse cutting axes facilitates an increase in the first fuse pitch in the fuse opening region. Unfortunately, it also increases the positioning time for the laser beam within the fuse opening region. This increased positioning time slows down the process of fuse cutting. Therefore, the number of the cutting axes should be reduced in order to improve a throughput of semiconductor memory devices in a fuse cutting process.

SUMMARY OF THE INVENTION

Embodiments of the invention provide a fuse structure for a semiconductor device capable of improving a throughput by reducing the number of cutting axes, and a method of fabricating same.

In one embodiment, the invention provides a semiconductor device comprising; a first fuse group comprising a plurality of first fuses, arranged in a first direction and having a first cutting axis, each first fuse comprising a first portion having a first fuse pitch, a second portion having a second fuse pitch smaller than the first fuse pitch, and a third portion connecting the first and second portions, a second fuse group comprising a plurality of second fuses, arranged in the first direction and having a second cutting axis, each second fuse comprising a first portion having a first fuse pitch, a second portion having a second fuse pitch smaller than the first fuse pitch, and a third portion connecting the first portion and the second portion, and a third fuse group comprising a plurality of third fuses, wherein each third fuse has either the first cutting axis or the second cutting axis, comprises a first pattern arranged in the first direction and having a first fuse pitch, and a second pattern arranged in a second direction and having a second fuse pitch smaller than the first fuse pitch, and is arranged to bypass the first fuse or the second fuse.

In another embodiment, the invention provides a fuse box for a semiconductor device comprising; second patterns of a third fuse group arranged on a semiconductor substrate and having a second fuse pitch, a first insulating layer formed on the second patterns of the third fuse group, contacts selectively exposing portions of the second patterns of the third fuse group, a first fuse group arranged on the first insulating layer, each first fuse in the first fuse group comprising a first portion having a first fuse pitch, a second portion having a second fuse pitch smaller than the first fuse pitch, and a third portion connecting the first and second portions, a second fuse group arranged on the first insulating layer, each second fuse in the second fuse group comprising a first portion having a first fuse pitch, a second portion having a second fuse pitch smaller than the first fuse pitch, and a third portion connecting the first and second portions, and first patterns of the third fuse group arranged on the first insulating layer, connected to the second patterns of the third fuse group via the contacts and having a first fuse pitch.

In another embodiment, the invention provides a method of forming a fuse box for a semiconductor device comprising; forming second patterns of a third fuse group having a second fuse pitch on a semiconductor substrate, forming a first insulating layer on the second patterns of the third fuse group, etching the first insulating layer to form contacts selectively exposing portions of the second patterns of the third fuse group, and forming on the first insulating layer, a first fuse group, each first fuse in the first fuse group comprising a first portion having a first fuse pitch, a second portion having a second fuse pitch smaller than the first fuse pitch, and a third portion connecting the first and second portions, a second fuse group, each second fuse in the second fuse group comprising a first portion having the first fuse pitch, a second portion having the second fuse pitch smaller than the first fuse pitch, and a third portion connecting the first and second portions, and first patterns of the third fuse group being electrically connected to the second patterns through the contacts and arranged in the first direction with a first fuse pitch greater than the second fuse pitch.

BRIEF DESCRIPTION OF THE DRAWINGS

FIGS. 3A through 11A are related plan views illustrating one possible method of forming a fuse box for a semiconductor device according to an embodiment of the present invention;

FIGS. 3B through 11B are related sectional views illustrating the method of forming a fuse box for the semiconductor device taken along line B-B of FIGS. 3A through 11A;

DESCRIPTION OF EMBODIMENTS

Figure 1A:
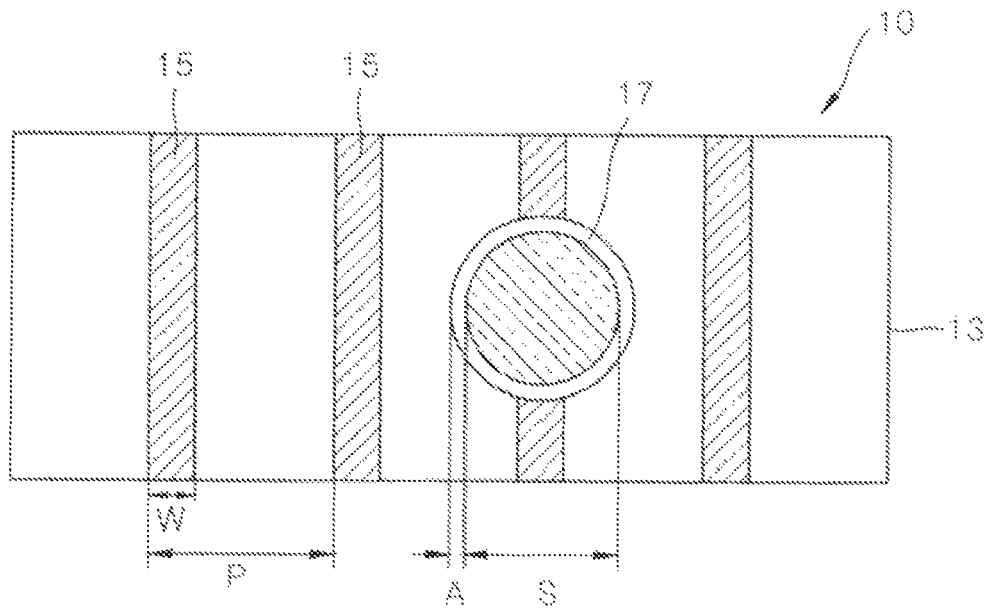
FIG. 1A is a plan view illustrating a fuse box for a conventional semiconductor device.
Figure 1B:
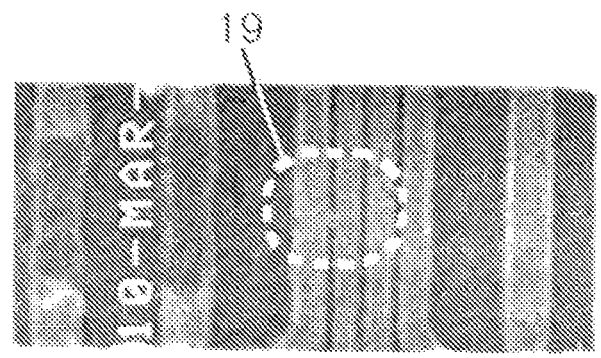
FIG. 1B is a photograph-showing a bridge formed during laser cutting in a conventional semiconductor device.
Figure 1B:

Embodiments of the invention will now be described with reference to the accompanying drawings. This invention may, however, be embodied in many different forms and should not be construed as being limited to only the embodiments set forth herein. Rather, these embodiments are provided as teaching example. In the drawings, the thicknesses of various layers and regions are exaggerated in size and proportion for the sake of clarity. Throughout the written description and drawings, like numbers refer to like or similar elements.

Figure 2A:
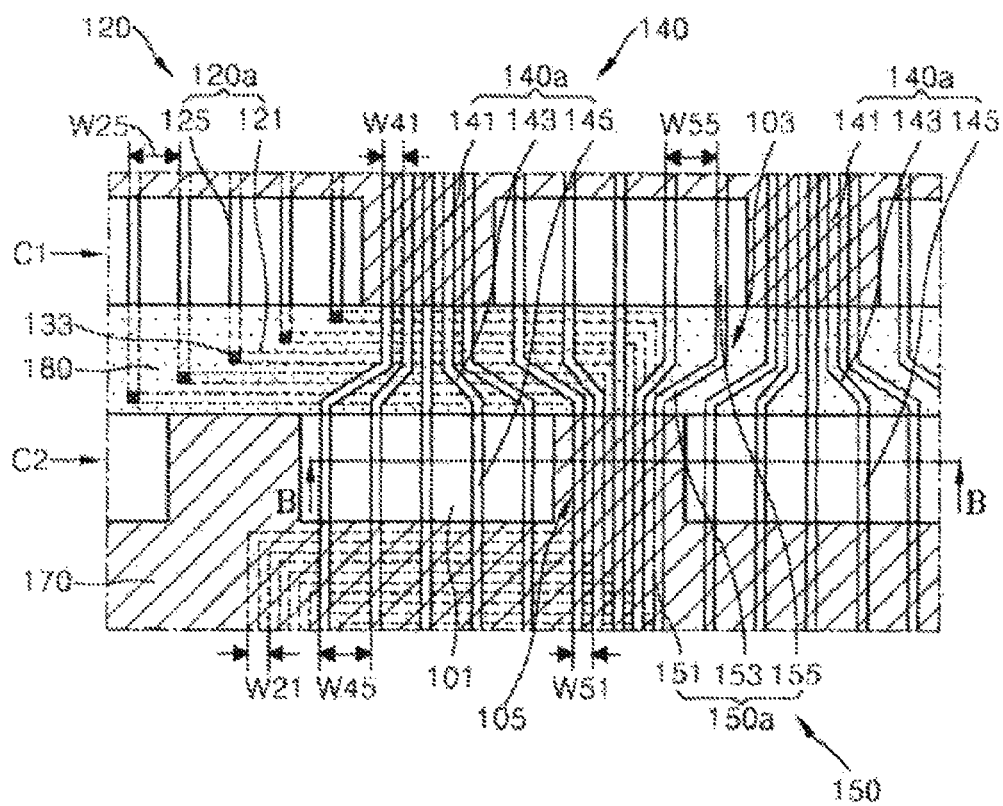
FIG. 2A is a plan view of a fuse box for a semiconductor device according to an embodiment of the present invention.
Figure 2B:
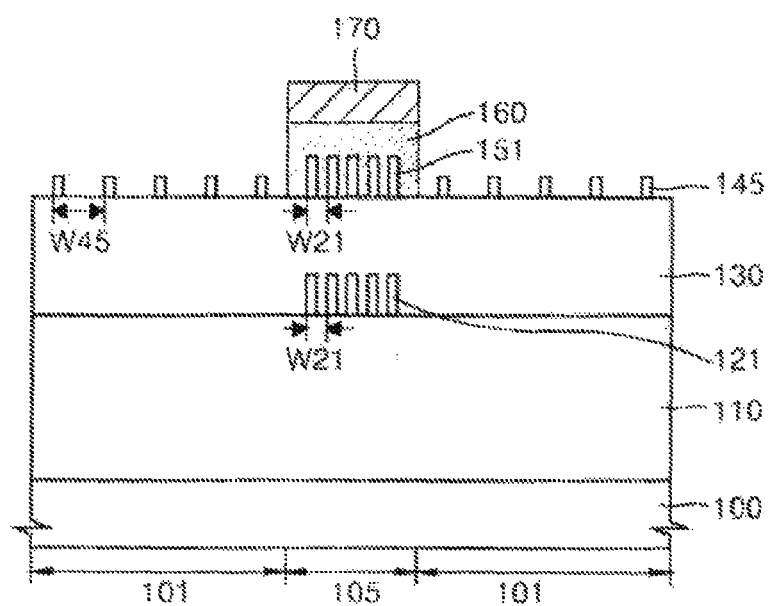
FIG. 2B is a sectional view of the fuse box for the semiconductor device taken along line IIB-IIB of FIG. 2A.

FIG. 2A is a plan view of a fuse box for a semiconductor device according to an embodiment of the present invention. FIG. 2B is a related sectional view of the fuse box of FIG. 2A taken along line IIB-IIB. Referring to FIGS. 2A and 2B, the fuse box comprises a first fuse group 140 having a first cutting axis C1, in which a plurality of first fuses 140a are arranged; a second fuse group 150 having a second cutting axis C2, in which a plurality of second fuses 150a are arranged; and a third fuse group 120 having the first cutting axis C1 or the second cutting axis C2, in which a plurality of third fuses 120a are arranged. The first fuse group 140 and the second fuse group 150 are arranged across from one another (i.e., in an opposing relationship). The first through third fuses 140a, 150a and 120a of the first through third fuse groups 140, 150 and 120 are each respectively arranged in a close fuse bundle having a second relatively narrow fuse pitch outside fuse opening region 101.

That is, the fuse box comprises a fuse opening region 101 exposing cutting portions of the first through third fuses 140a, 150a, and 120a; a fuse non-opening region 105 in which fuses 140a, 150a, and 120a are not exposed; and a fuse connection region 103 connecting the fuse opening region 101 and the fuse non-opening region 105.

In the first fuse group 140, the first fuse 140a comprises a first portion 145 having a first fuse pitch W45 in the fuse opening region 101; a second portion 141 having a second fuse pitch W41 in the fuse non-opening region 105; and a third portion 143 connecting the first portion 145 and the second portion 141 in the fuse connection region 103. In the second fuse group 150, the second fuse 150a comprises a first portion 155 having a first fuse pitch W55 in the fuse opening region 101; a second portion 151 having a second fuse pitch W51 in the fuse non-opening region 105; and a third portion 153 connecting the first portion 155 and the second portion 151 in the fuse connection region 103.

The first fuse pitch W45 of the first fuse group 140 is equal to the first fuse pitch W55 of the second fuse group 150, and the second fuse pitch W41 of the first fuse group 140 is equal to the second fuse pitch W51 of the second fuse group 150. The first fuse pitches W45 and W55 of the first and second fuse groups 140 and 150 are greater than the second fuse pitches W41 and W51 of the first and second fuse groups 140 and 150. The first fuse pitch W45 of the first fuse group 140, and the first fuse pitch W55 of the second fuse group 150 preferably have a value greater than a deviation range of the positioning accuracy during laser cutting, and the second fuse pitch W41 of the first fuse group 140 and the second fuse pitch W51 of the second fuse group 150 preferably have a minimum value obtainable during the fabrication of the constituent semiconductor device (i.e., the narrowest pitch practicable under given process assumptions).

In the third fuse group 120, the third fuse 120a comprises a first pattern 125 having a first fuse pitch W25 in the fuse opening region 101, and a second pattern 121 having a second fuse pitch W21 in the fuse non-opening region 105. A third fuse 120a of the third fuse group 120 has a bypass structure with respect to the first fuse group 140 or the second fuse group 150. While the first fuse 140a of the first fuse group 140, and the second fuse 150a of the second fuse group 150 are formed on a second insulating layer 130, the second pattern 121 in the third fuse 120a of the third fuse group 120 is formed on the first insulating layer 110, and the first pattern 125 in the third fuse 120a of the third fuse group 120 is formed on the second insulating layer 130, and the first pattern 125 and the second pattern 121 are connected via a contact 133. Since the second pattern 121 has a bypass shape, the second pattern 121 may overlap with the second portion 151 of the second fuse 150a of the second fuse group 150 in the fuse non-opening region 101.

The first fuse pitch W25 of the third fuse group 120 is equal to the first fuse pitch W45 of the first fuse group 140 and the first fuse pitch W55 of the second fuse group 150, and the second fuse pitch W21 of the third fuse group 120 is equal to the second fuse pitch W41 of the first fuse group 140 and the second fuse pitch W51 of the second fuse group 150. The third fuse group 120 is aligned to have the same cutting axis C2 as that of the second fuse group 150, but may be aligned to have the same cutting axis C1 as that of the first fuse group 140, or may be aligned to have the same cutting axis C1 as that of the first fuse group 140 and simultaneously to have the same cutting axis C2 as that of the second fuse group 150. The structure in that the second pattern 121 of the third fuse group 120 bypasses with respect to the first fuse group 140 and the second fuse group 150 is not limited to the arranged structure shown in FIGS. 2A and 2B, but may be modified in various shapes.

Here, the fuses arranged in the cutting axes C1 and C2 may be cut by a laser beam on the same axis.

In the illustrated example, a third insulating layer 160 and a metal capping layer 170 are formed on the second insulating layer 130 to cover the first through third fuse groups 140, 150, and 120 except for the first portions 145 and 155 and the first pattern 125 exposed by the fuse opening region 101. A passivation layer 180 is formed at the position corresponding to the connection region 103 on the capping layer 170. The passivation layer 180 may be formed from a nitride layer. In certain embodiments, an interlayer insulating layer as a fourth insulating layer may be interposed below the passivation layer 180.

FIGS. 3A through 11A are related plan views illustrating one possible method of forming a fuse box for a semiconductor device according to an embodiment of the invention. FIGS. 3B through 11B are related sectional views further illustrating the method of FIGS. 3A through 11A taken along line B-B.

Figure 3A:
Figure 3B:
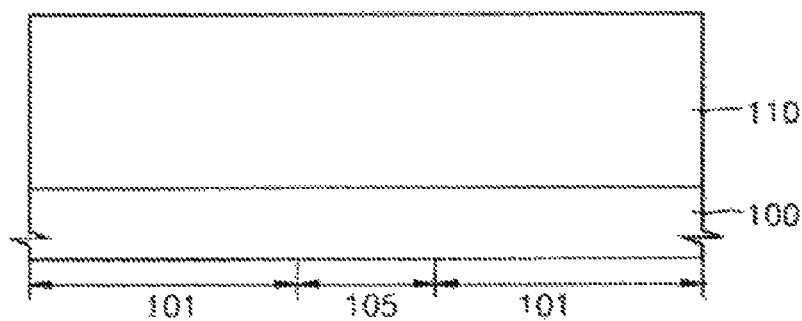

Referring to FIGS. 3A and 3B, a first insulating layer 110 is formed on a semiconductor substrate 100. The first insulating layer 110 comprises an oxide layer as an interlayer insulating layer. The first insulating layer may comprise a first interlayer insulating layer, a second interlayer insulating layer, and a third interlayer insulating layer. As one example, the first interlayer insulating layer may be formed at a thickness of 2500 to 3500 Å. The second interlayer insulating layer may comprise multi-layers, and may be formed at a thickness of, for example, 2500 to 3500 Å/550 to 650 Å/1450 to 1550 Å. The third interlayer insulating layer may be formed at a thickness of 25000 to 35000 Å.

Figure 4A:
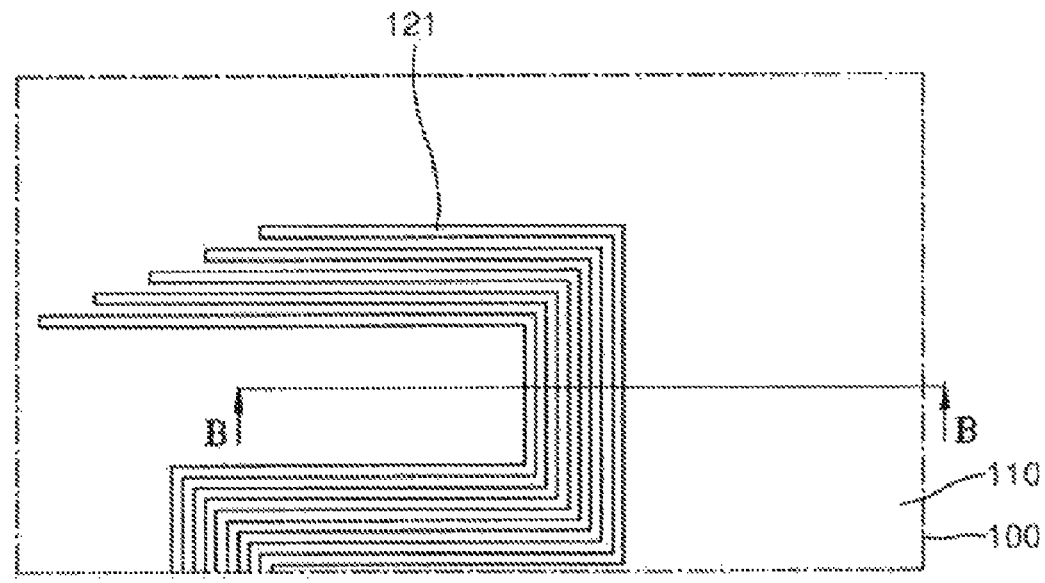
Figure 4B:
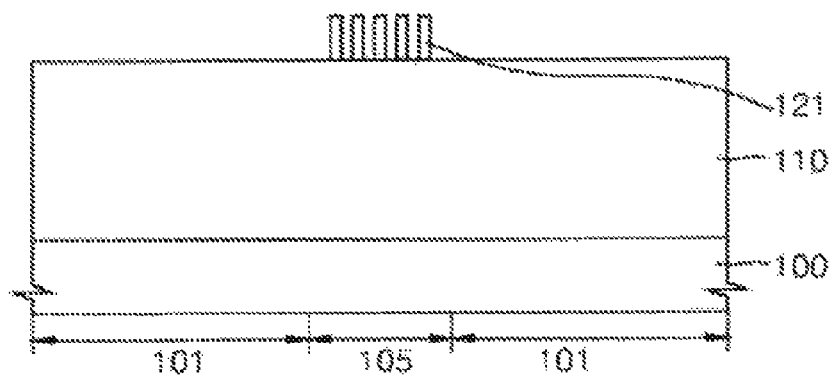

Referring to FIGS. 4A and 4B, a first metal layer is deposited on the first insulating layer 110. For example, the first metal layer may be formed of an Al layer at a thickness of about 4500 to 5500 Å. Before the first metal layer is formed, Ti/TiN layers as a barrier layer may be formed at a thickness of 4500 to 5500 Å. The first metal layer is patterned, thereby forming a second pattern 121 of the third fuse 120a. Since the second pattern 121 of the third fuse 120a is not exposed by the fuse opening region 101, the second pattern 121 is preferably formed with a minimum fuse pitch W21 (FIG. 2A) allowable in the fabrication of a semiconductor device. At this time, although not shown in the drawings, a first metal interconnection may be formed in a memory cell region Further, the second pattern 121 of the third fuse 120a may comprise a polysilicon layer.

Figure 5A:
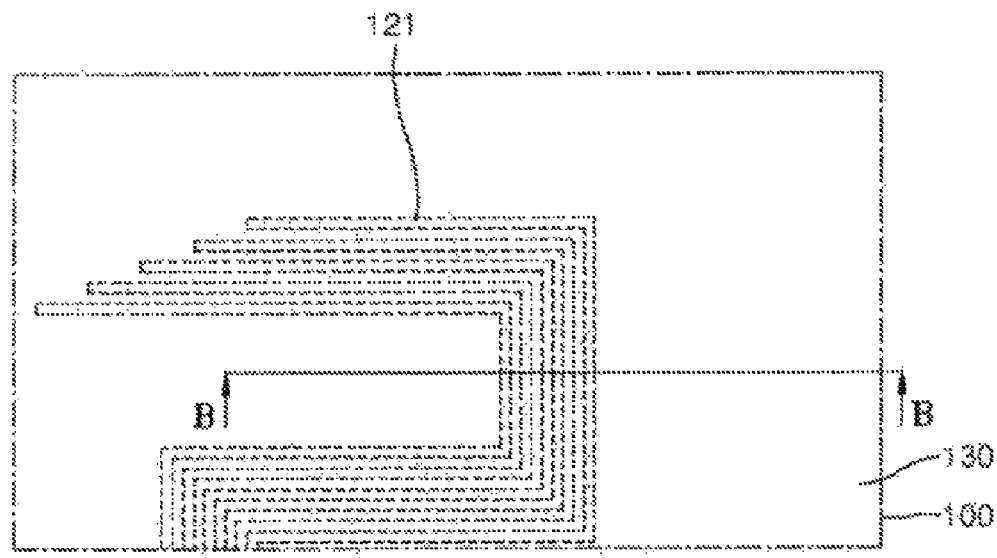
Figure 5B:
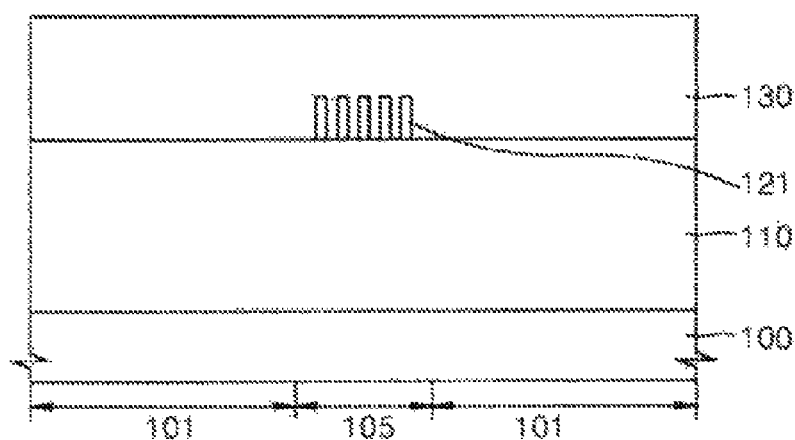

Referring to FIGS. 5A and 5B, a second insulating layer 130 is formed on the first insulating layer 110 to cover the second pattern 121 of the third fuse 120a. The second insulating layer 130 may comprise an oxide layer as an interlayer insulating layer. The second insulating layer 130 may comprise an upper interlayer insulating layer and a lower interlayer insulating layer. For example, the lower interlayer insulating layer may comprise multi-layers, each having a thickness of, for example, 450 to 550 Å/4500 to 5500 Å. The upper interlayer insulating layer may be formed at a thickness of 2500 to 3500 Å.

Figure 6A:
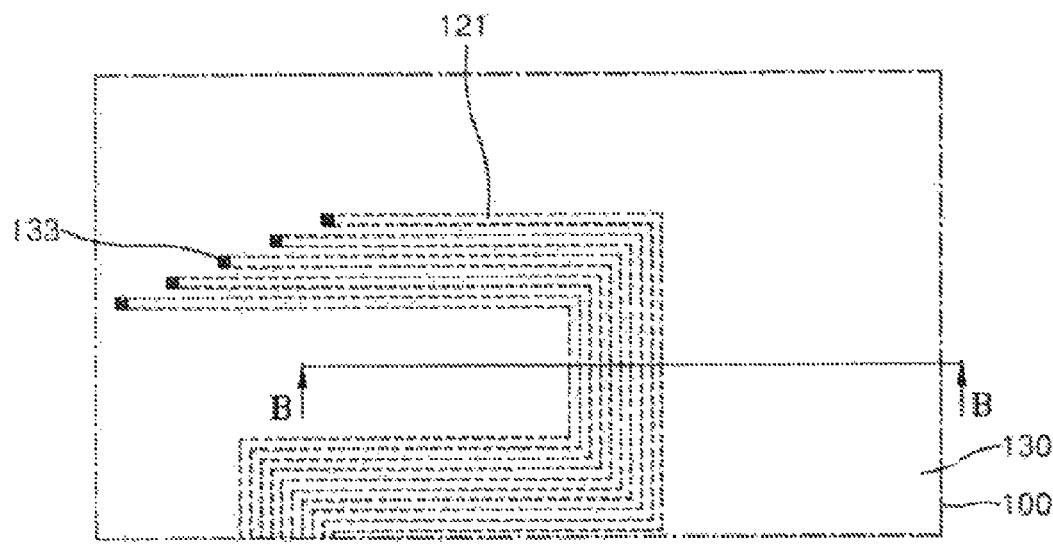
Figure 6B:
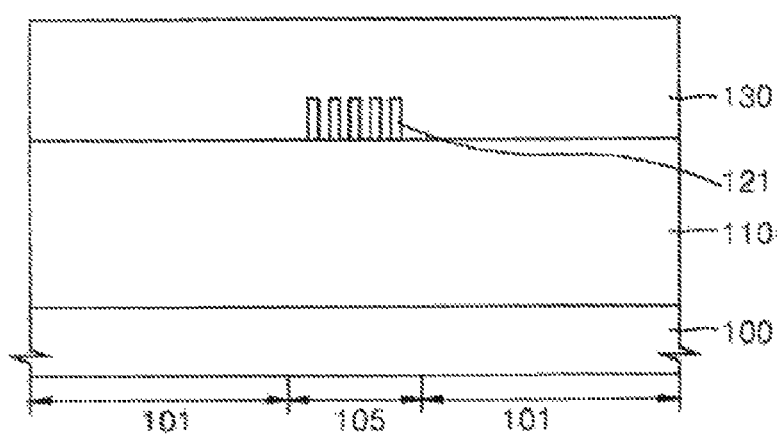

Referring to FIGS. 6A and 6B, the second insulating layer 130 is etched, thereby forming a contact 133 exposing the second pattern 121 of the third fuse 120a. Although not shown in the drawings, the contact 133 may be formed simultaneously when forming a via which opens a part of the first metal interconnection in the memory cell region.

Figure 7A:
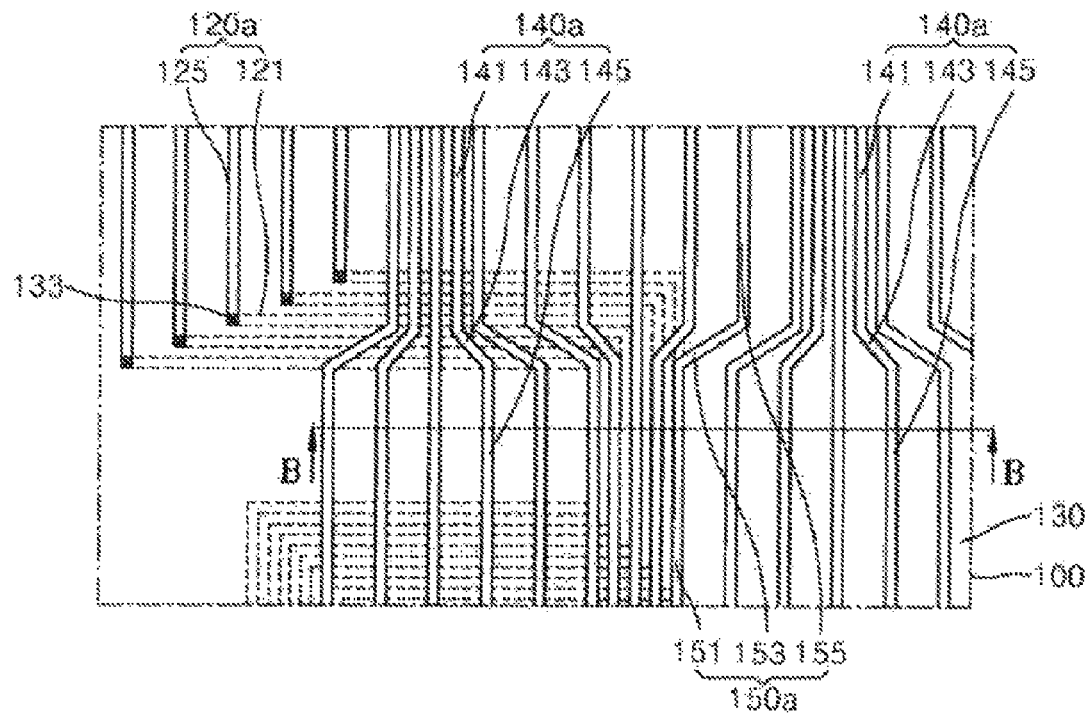
Figure 7B:
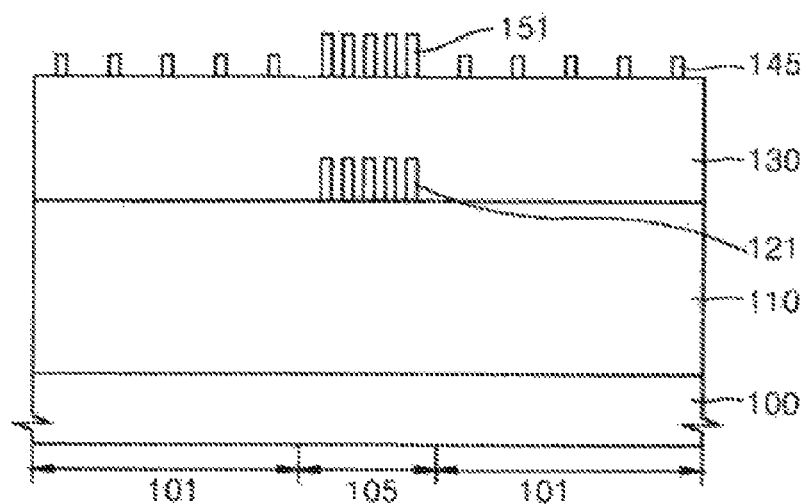

Referring to FIGS. 7A and 7B, a second metal layer is deposited on the second insulating layer 130 such that the contact 133 is buried. For example, the second metal layer may be formed of an Al layer at a thickness of 5500 to 6500 Å. Ti/TiN layers as a barrier layer may be formed at a thickness of 1500 to 2500 Å below the metal layer. As another example, after a contact plug is formed in the contact 133, the second metal layer may be deposited on the second insulating layer 130. The second metal layer is patterned, thereby forming a first fuse 140a of the first fuse group 140, a second fuse 150a of the second fuse group 150, and a first pattern 125 of a third fuse 120a of the third fuse group 120, Although not shown in the drawings, a second metal interconnection may be formed in the memory cell region. Further, the first pattern 125 of the third fuse 120a may comprise a polysilicon layer.

The first pattern 125 and the second pattern 121 of the third fuse 120a are electrically connected through the contact 133, so that the third fuse 120a has a bypass shape. Referring to FIG. 2A again, the first fuse 140a is arranged such that a first portion 145 has a first fuse pitch W45, and a second portion 141 has a second fuse pitch W41. The second fuse 150a is arranged such that a first portion 155 has a first fuse pitch W55, and a second portion 151 has a second fuse pitch W51. The second portion 151 of the second fuse 150a, and the second portion 121 of the third fuse 120a may be arranged to overlap with each other.

Figure 8A:
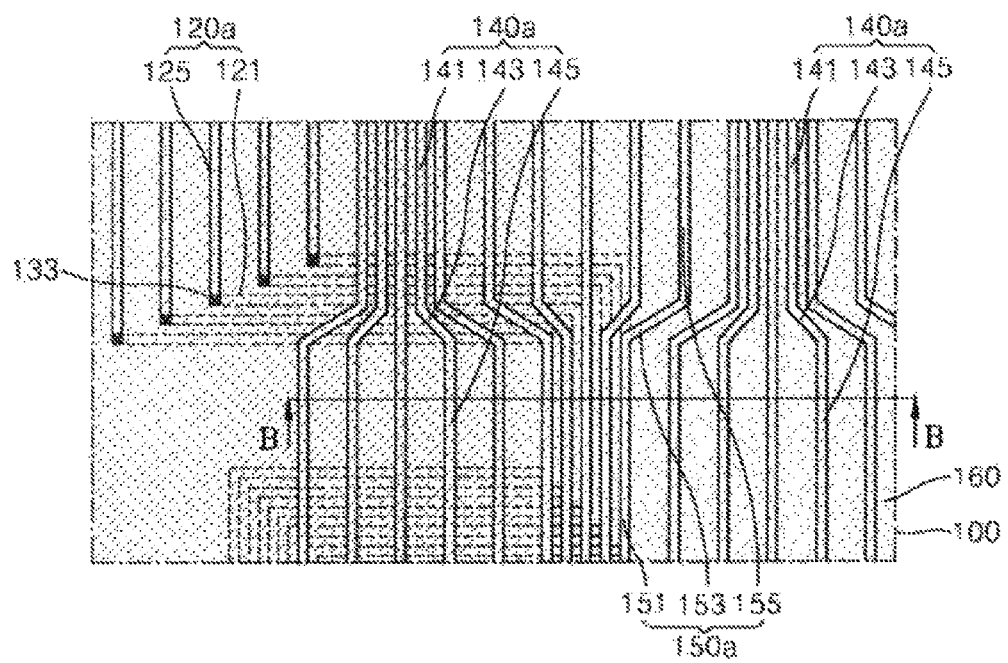
Figure 8B:
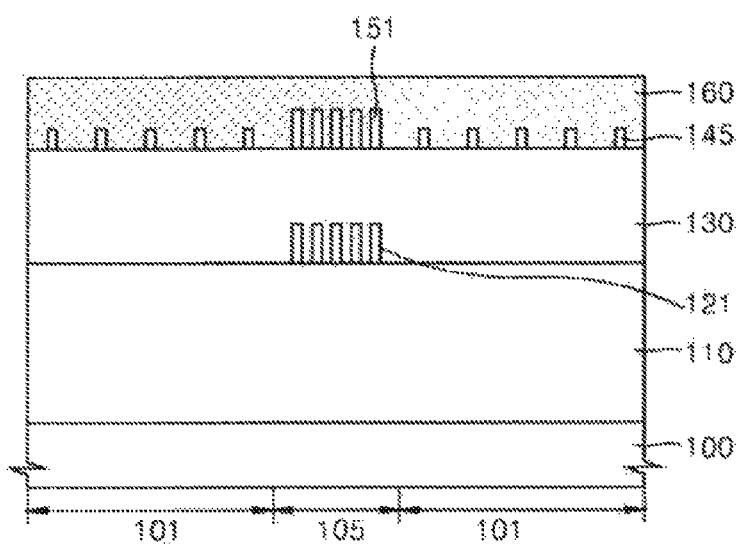

Referring to FIGS. 8A and 8B, a third insulating layer 160 is deposited on the first fuse group 140, the second fuse group 150, the third fuse group 120, and the second insulating layer 130. The third insulating layer 160 comprises an oxide layer as an interlayer insulating layer. The third insulating layer 160 may comprise an upper interlayer insulating layer and a lower interlayer insulating layer. The upper interlayer insulating layer and the lower interlayer insulating layer may be formed at thicknesses of 6000 to 7000 Å and 6500 to 7500 Å respectively.

Figure 9A:
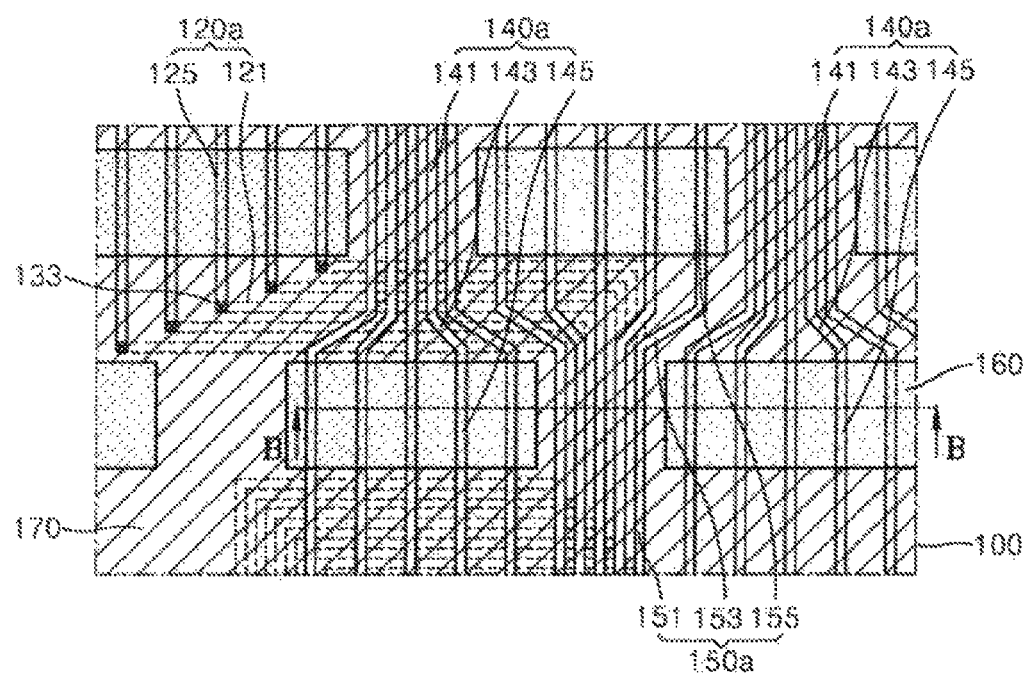
Figure 9B:
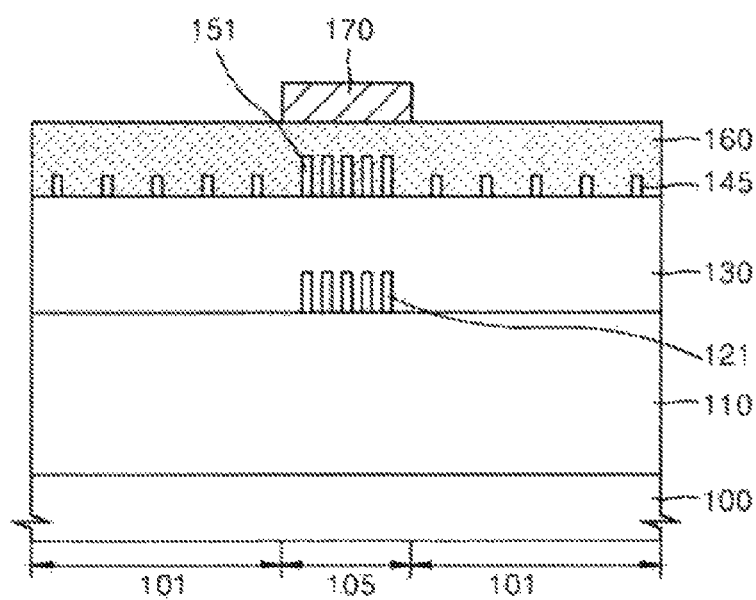

Referring to FIGS. 9A and 9B, a third metal layer is deposited on the third insulating layer 160. For example, the third metal layer may be formed of an Al layer at a thickness of 6500 to 7500 Å. Ti/TiN layers as a barrier layer may be formed below the third metal layer. The third metal layer is patterned, thereby forming a capping layer 170. The capping layer 170 is formed to cover the portion of the third insulating layer 160 corresponding to where the fuses 120a, 140a, and 150a having small second fuse pitches W21, W41, and W51 are arranged in bundles, and to expose the portion of the third insulating layer corresponding to where the fuses 120a, 140a, and 150a having large first fuse pitches W25, W45, and W55 are arranged. Although not shown in the drawings, a third metal interconnection may be formed in the memory cell region.

Figure 10A:
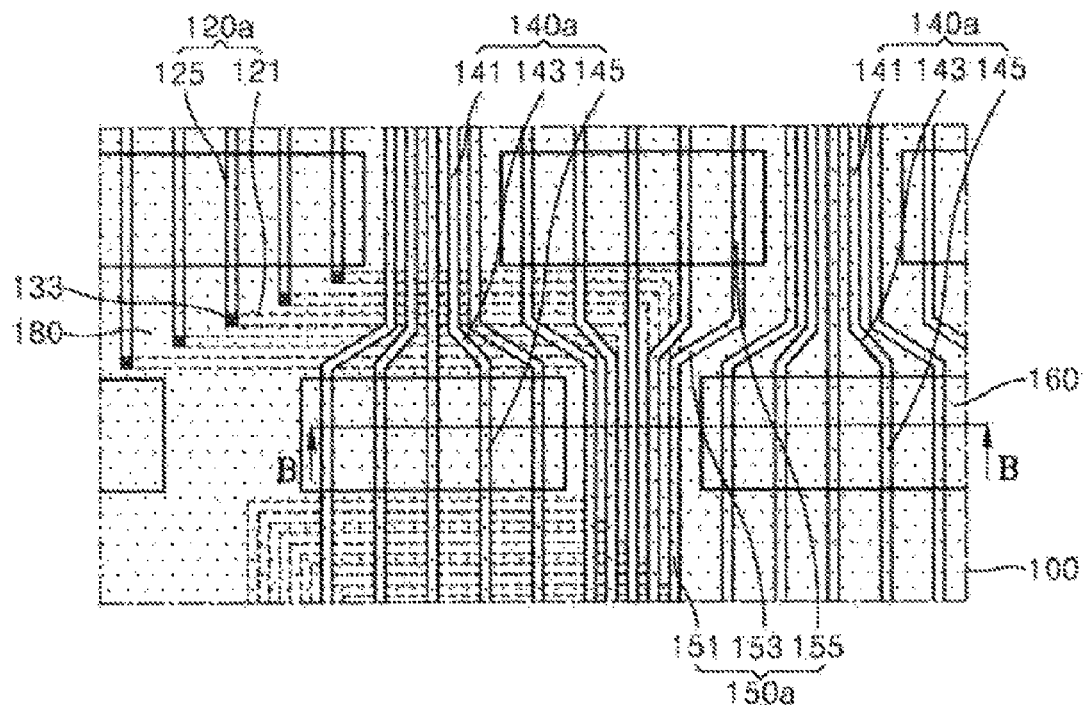
Figure 10B:
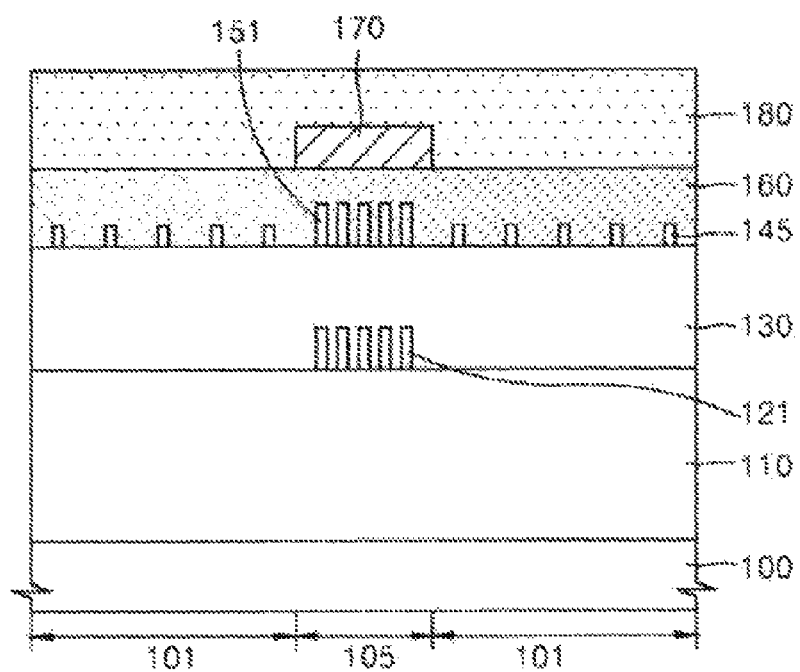

Referring to FIGS. 10A and 10B, a fourth insulating layer 180 is formed on the capping layer 170 and the third insulating layer 160. The fourth insulating layer 180 as a passivation layer may be formed of, for example, a nitride layer at a thickness of 5500 to 6500 Å. The fourth insulating layer 180 may comprise an interlayer insulating layer and a passivation layer. The interlayer insulating layer comprises an oxide layer. The interlayer insulating layer comprises an upper interlayer insulating layer and a lower interlayer insulating layer, and may be formed at thicknesses of 6000 to 7000 Å and 7500 to 8500 Å respectively.

Figure 11A:
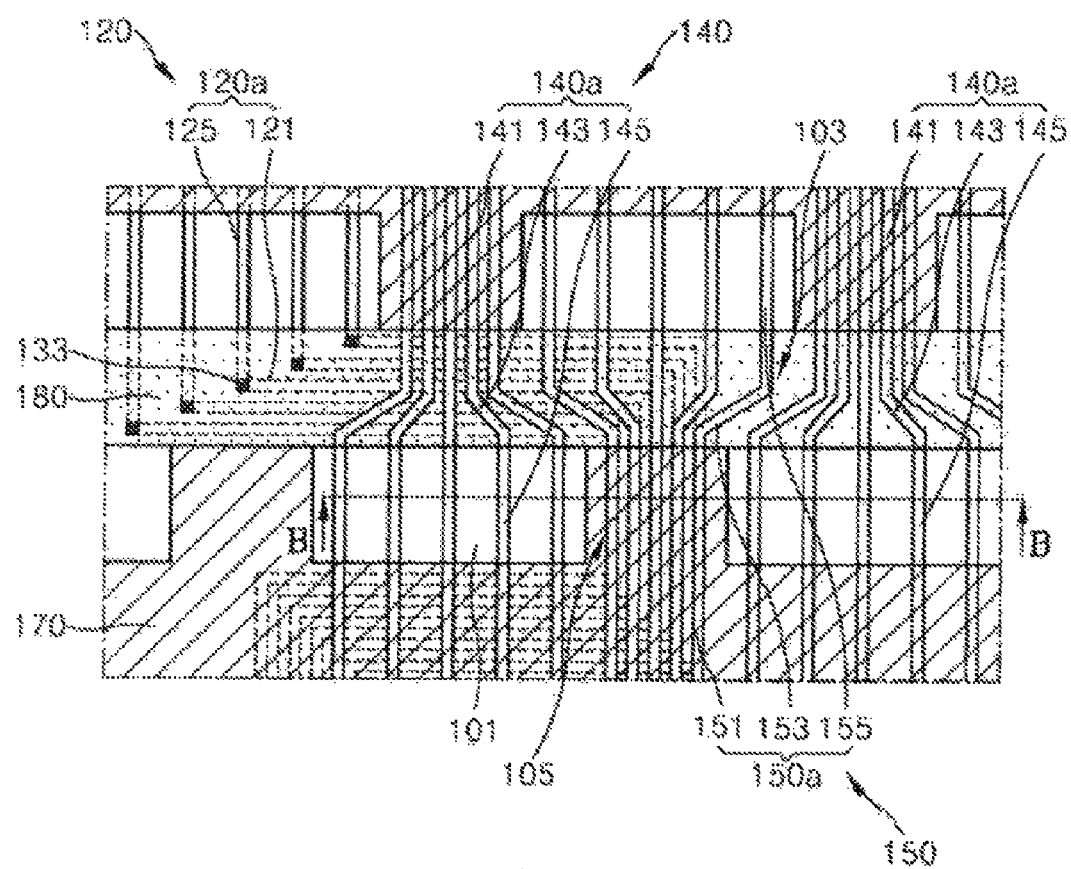
Figure 11B:
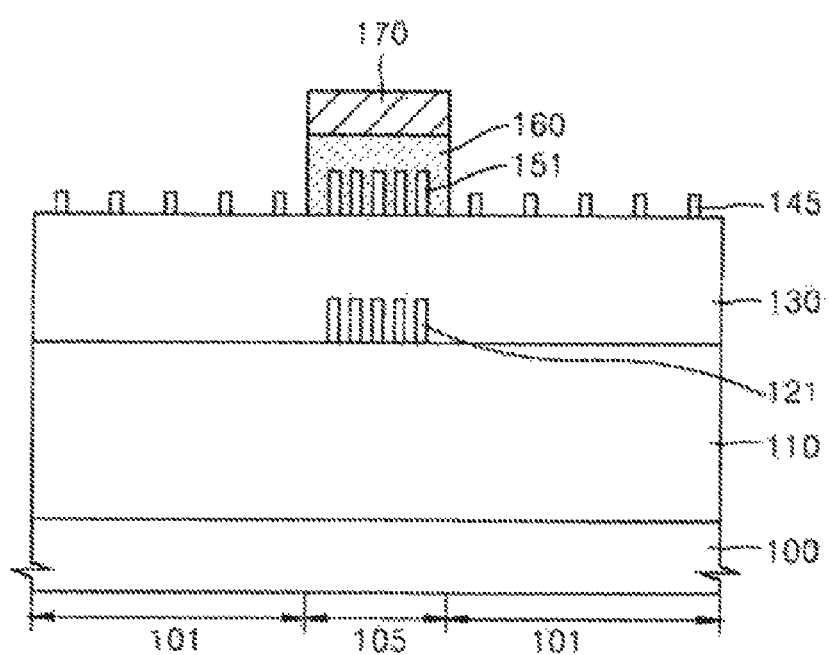

Referring to FIGS. 11A and 11B, the fourth insulating layer 180 and the third insulating layer 160 are patterned, so that the fourth insulating layer 180 remains only on the capping layer 170 corresponding to the fuse connection region 103, and a fuse opening region 101 exposing the first portions 145 and 155 and the first pattern 125 of the first through third fuses 140a, 150a, and 120a is formed. At this time, the capping layer 170 functions as an etch mask during an etch process of the third insulating layer 160 to form the fuse opening region 101. Then, the first portions 145 and 155 of the first and second fuses 140a and 150a, and the first pattern 125 of the third fuse 120a, which are exposed by the fuse opening region 101, are partially etched to facilitate easy cutting by laser.

Figure 12A:
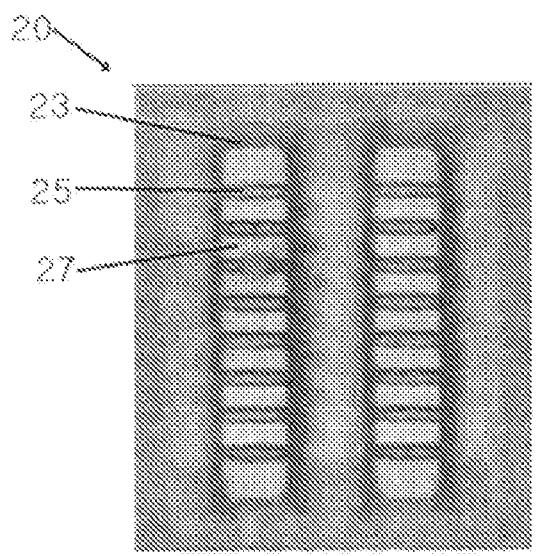
FIG. 12A is a plan view photograph of a fuse box for a semiconductor device having a fuse bypass structure after repair according to an embodiment of the present invention.
Figure 12B:
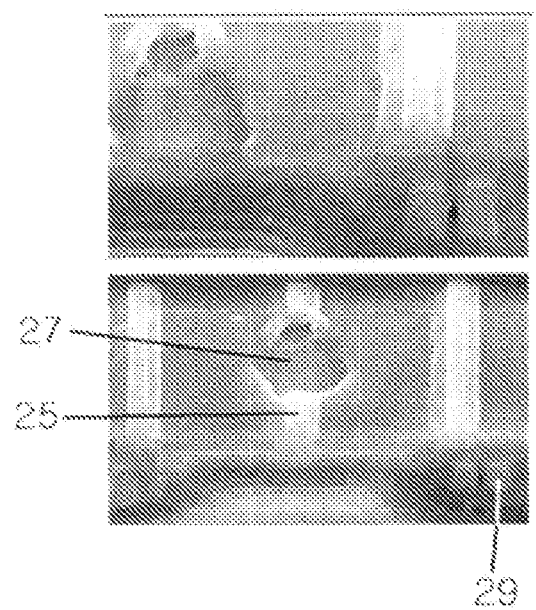
FIG. 12B is a sectional view photograph of the fuse box after repairing the fuse of FIG. 12A.

FIG. 12A is a plan view photograph showing of a fuse box for a semiconductor device having a fuse with a bypass structure after repair according to an embodiment of the present invention, and FIG. 12B is a related section photograph showing the fuse box after repairing the fuse of FIG. 12.

Referring to FIGS. 12A and 12B, a fuse 25 of a fuse box 20 is aligned so as to be exposed through a fuse opening region 23. A reference number '27' represents a cutting portion of the fuse 25 by a laser cutting process. It is shown that a fuse 29 aligned in a fuse non-opening region is not damaged by the cutting of the fuse 25.

As described above, according to embodiments of the present invention, by arranging the fuses in a bypass shape, closely bundled fuses are not damaged by heat generated from proximate laser cutting. The number of the cutting axes is also reduced, thereby improving processing throughout.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A fuse box for a semiconductor device comprising:
a first fuse group comprising a plurality of first fuses, arranged in a first direction and having a first cutting axis, each first fuse comprising a first portion having a first fuse pitch, a second portion having a second fuse pitch smaller than the first fuse pitch, and a third portion connecting the first and second portions;
a second fuse group comprising a plurality of second fuses, arranged in the first direction and having a second cutting axis, each second fuse comprising a first portion having a first fuse pitch, a second portion having a second fuse pitch smaller than the first fuse pitch, and a third portion connecting the first portion and the second portion; and
a third fuse group comprising a plurality of third fuses, wherein each third fuse has either the first cutting axis or the second cutting axis, comprises a first pattern arranged in the first direction and having a first fuse pitch, and a second pattern arranged in a second direction and having a second fuse pitch smaller than the first fuse pitch, and is arranged to bypass the first fuse or the second fuse.

2. The fuse box of claim 1, wherein the first portion of each first fuse in the first fuse group and the second portion of each second fuse in the second fuse group are arranged in parallel in the first direction, and the second portion of each first fuse in the first fuse group and the first portion of each second fuse in the second fuse group are arranged in parallel to each other in the first direction, and
the first pattern of each third fuse in the third fuse group is arranged in parallel with either the first portion of each first fuse or the first portion of each second fuse in the first direction.

3. The fuse box of claim 2, wherein the first fuse pitch of the first fuse is equal to the first fuse pitch of the second fuse and the first fuse pitch of the third fuse, and
wherein the second fuse pitch of the first fuse is equal to the second fuse pitch of the second fuse and the second fuse pitch of the third fuse.

4. The fuse box of claim 3, wherein the first portion of each first fuse in the first fuse group is arranged relative to the first cutting axis; the first portion of each second fuse in the second fuse group is arranged relative to the second cutting axis; and the first pattern of each third fuse in the third fuse group is arranged relative to either the first cutting axis or the second cutting axis.

5. The fuse box of claim 1, wherein the first and second patterns of the third fuse group are connected via a contact.

6. A fuse box for a semiconductor device comprising:
second patterns of a third fuse group arranged on a semiconductor substrate and having a second fuse pitch;
a first insulating layer formed on the second patterns of the third fuse group;
contacts selectively exposing portions of the second patterns of the third fuse group;
a first fuse group arranged on the first insulating layer, each first fuse in the first fuse group comprising a first portion having a first fuse pitch, a second portion having a second fuse pitch smaller than the first fuse pitch, and a third portion connecting the first and second portions;
a second fuse group arranged on the first insulating layer, each second fuse in the second fuse group comprising a first portion having a first fuse pitch, a second portion having a second fuse pitch smaller than the first fuse pitch, and a third portion connecting the first and second portions; and
first patterns of the third fuse group arranged on the first insulating layer, connected to the second patterns of the third fuse group via the contacts and having a first fuse pitch.

7. The fuse box of claim 6, wherein each fuse in the first fuse group, second fuse group and third fuse group comprises a metal layer or a polysilicon layer.

8. The fuse box of claim 6, wherein the second pattern of the third fuse group is arranged in relation to the second portion of the first fuse or the second portion of the second fuse.

9. The fuse box of claim 6, wherein the first portion of each fuse in the first fuse group and the second portion of each fuse in the second fuse group are arranged in parallel in a first direction, and the second portion of each fuse in the first fuse group and the first portion of each fuse in the second fuse group are arranged in parallel in the first direction, and
the first pattern of each fuse in the third fuse group is arranged in parallel with either the first portion of each fuse in the first fuse group or the first portion of each fuse in the second fuse group in the first direction.

10. The fuse box of claim 9, wherein the first fuse pitch of each fuse in the first fuse group is equal to the first fuse pitch of each fuse in the second fuse group and the first fuse pitch of each fuse in the third fuse group, and wherein the second fuse pitch of each fuse in the first fuse group is equal to the second fuse pitch of each fuse in the second fuse group and the second fuse pitch of each fuse in the third fuse group.

11. The fuse box of claim 6, further comprising:

a second insulating layer formed on the first insulating layer; and a capping layer formed on the second insulating layer and having the fuse opening region formed thereon, the fuse opening region partially exposing the first portion of each fuse in the first fuse group, the first portion of each fuse in the second fuse group, and the first pattern of each fuse in the third fuse group.

12. The fuse box of claim 11, wherein the capping layer comprises a metal layer.

13. The fuse box of claim 11, further comprising:

a passivation layer formed in relation to the third portions of each fuse in the first fuse group and the second fuse group on the capping layer.

14. The fuse box of claim 13, wherein the passivation layer is formed from a nitride layer.

* * * * *